(12) United States Patent
Reed et al.

(10) Patent No.: US 8,110,899 B2
(45) Date of Patent: Feb. 7, 2012

(54) METHOD FOR INCORPORATING EXISTING SILICON DIE INTO 3D INTEGRATED STACK

(75) Inventors: Paul A. Reed, Austin, TX (US); Bryan P. Black, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 349 days.

(21) Appl. No.: 11/613,774

(22) Filed: Dec. 20, 2006

(65) Prior Publication Data

US 2008/0150088 A1 Jun. 26, 2008

(51) Int. Cl.
*H01L 23/48* (2006.01)

(52) U.S. Cl. ....... 257/621; 257/618; 257/678; 257/723; 257/E27.001; 438/109

(58) Field of Classification Search .......... 257/621, 257/40, 686, 723, 737, 777, 678, E25.011; 438/108, 109
See application file for complete search history.

(56) References Cited

U.S. PATENT DOCUMENTS

| | | | | |
|---|---|---|---|---|
| 5,485,039 A * | 1/1996 | Fujita et al. | | 257/774 |
| 5,702,984 A * | 12/1997 | Bertin et al. | | 438/15 |
| 5,973,392 A * | 10/1999 | Senba et al. | | 257/686 |
| 5,990,564 A * | 11/1999 | Degani et al. | | 257/778 |
| 6,025,638 A * | 2/2000 | Pogge et al. | | 257/618 |
| 6,052,287 A * | 4/2000 | Palmer et al. | | 361/767 |
| 6,255,899 B1 * | 7/2001 | Bertin et al. | | 327/564 |
| 6,348,728 B1 * | 2/2002 | Aiba et al. | | 257/678 |
| 6,362,525 B1 * | 3/2002 | Rahim | | 257/738 |
| 6,461,897 B2 * | 10/2002 | Lin et al. | | 438/109 |
| 6,483,043 B1 * | 11/2002 | Kline | | 174/262 |
| 6,507,115 B1 * | 1/2003 | Hofstee et al. | | 257/777 |
| 6,563,205 B1 * | 5/2003 | Fogal et al. | | 257/686 |
| 6,593,644 B2 * | 7/2003 | Chiu et al. | | 257/684 |
| 6,620,647 B2 * | 9/2003 | Kröner | | 438/107 |
| 6,642,610 B2 * | 11/2003 | Park et al. | | 257/678 |
| 6,661,086 B2 * | 12/2003 | Zelsacher | | 257/687 |
| 6,677,668 B1 * | 1/2004 | Lin | | 257/685 |
| 6,696,765 B2 * | 2/2004 | Kazama et al. | | 257/779 |
| 6,717,251 B2 * | 4/2004 | Matsuo et al. | | 257/686 |

(Continued)

OTHER PUBLICATIONS

Intel Corporation, Office Action dated Feb. 12, 2010 for Chinese Application No. 200780047011.3.

(Continued)

*Primary Examiner* — Victor A Mandala
*Assistant Examiner* — William Harriston
(74) *Attorney, Agent, or Firm* — Blakely, Sokoloff, Taylor & Zafman LLP

(57) ABSTRACT

An apparatus including a first die including a plurality of conductive through substrate vias (TSVs); and a plurality of second dice each including a plurality of contact points coupled to the TSVs of the first die, the plurality of second dice arranged to collectively include a surface area approximating a surface area of the first die. A method including arranging a plurality of second dice on a first die such that collectively the plurality of second dice include a surface area approximating the surface area of the first die; and electrically coupling a plurality of second device to a plurality of the first die. A system including an electronic appliance including a printed circuit board and a module, the module including a first die including a plurality of TSVs; and the plurality of second dice arranged to collectively include a surface area approximating the surface area of the first die.

18 Claims, 4 Drawing Sheets

U.S. PATENT DOCUMENTS

| | | | |
|---|---|---|---|
| 6,731,009 B1 * | 5/2004 | Jones et al. | 257/777 |
| 6,798,049 B1 * | 9/2004 | Shin et al. | 257/678 |
| 6,815,808 B2 * | 11/2004 | Hyodo et al. | 257/678 |
| 6,911,730 B1 * | 6/2005 | New | 257/724 |
| 6,929,976 B2 * | 8/2005 | Chan et al. | 438/106 |
| 6,961,231 B1 * | 11/2005 | Alexander et al. | 361/321.2 |
| 7,030,470 B1 * | 4/2006 | Ho et al. | 257/662 |
| 7,035,113 B2 * | 4/2006 | Fraley et al. | 361/783 |
| 7,045,892 B2 * | 5/2006 | Kyung | 257/723 |
| 7,058,247 B2 * | 6/2006 | Crow et al. | 385/14 |
| 7,060,601 B2 * | 6/2006 | Savastiouk et al. | 438/584 |
| 7,061,092 B2 * | 6/2006 | Akram et al. | 257/690 |
| 7,064,005 B2 * | 6/2006 | Takaoka | 438/108 |
| 7,078,818 B2 * | 7/2006 | Fujimoto et al. | 257/777 |
| 7,109,068 B2 | 9/2006 | Akram et al. | |
| 7,112,887 B2 * | 9/2006 | Swan et al. | 257/777 |
| 7,132,753 B1 * | 11/2006 | St. Amand et al. | 257/777 |
| 7,161,810 B2 * | 1/2007 | Fraley et al. | 361/719 |
| 7,202,554 B1 * | 4/2007 | Kim et al. | 257/686 |
| 7,239,012 B2 * | 7/2007 | Pepe et al. | 257/686 |
| 7,242,100 B2 * | 7/2007 | Oka | 257/778 |
| 7,247,932 B1 * | 7/2007 | Lin et al. | 257/686 |
| 7,279,795 B2 * | 10/2007 | Periaman et al. | 257/777 |
| 7,402,442 B2 * | 7/2008 | Condorelli et al. | 438/5 |
| 7,486,525 B2 * | 2/2009 | Knickerbocker | 361/760 |
| 7,498,668 B2 * | 3/2009 | Kawabata et al. | 257/686 |
| 7,514,775 B2 * | 4/2009 | Chao et al. | 257/686 |
| 7,518,225 B2 * | 4/2009 | Emma et al. | 257/686 |
| 7,586,183 B2 * | 9/2009 | Kawabata et al. | 257/686 |
| 7,595,559 B2 * | 9/2009 | Baek | 257/777 |
| 7,692,278 B2 * | 4/2010 | Periaman et al. | 257/686 |
| 7,746,656 B2 * | 6/2010 | Shim et al. | 361/760 |
| 7,768,005 B2 * | 8/2010 | Condorelli et al. | 257/48 |
| 7,893,540 B2 * | 2/2011 | Ishino et al. | 257/777 |
| 2002/0016021 A1 * | 2/2002 | Sutherland | 438/107 |
| 2002/0074637 A1 * | 6/2002 | McFarland | 257/686 |
| 2002/0140069 A1 * | 10/2002 | Lee et al. | 257/678 |
| 2003/0123240 A1 * | 7/2003 | McIlnay et al. | 361/804 |
| 2004/0021139 A1 * | 2/2004 | Jackson et al. | 257/40 |
| 2004/0056342 A1 * | 3/2004 | Cobbley et al. | 257/678 |
| 2004/0075170 A1 * | 4/2004 | Degani et al. | 257/724 |
| 2004/0115867 A1 * | 6/2004 | Shibata | 438/125 |
| 2005/0127490 A1 * | 6/2005 | Black et al. | 257/686 |
| 2006/0043569 A1 * | 3/2006 | Benson et al. | 257/698 |
| 2006/0077749 A1 * | 4/2006 | Kuo et al. | 365/232 |
| 2006/0202317 A1 * | 9/2006 | Barakat et al. | 257/686 |
| 2006/0267171 A1 * | 11/2006 | Lee | 257/678 |
| 2006/0275957 A1 * | 12/2006 | Shibata | 438/128 |
| 2006/0278979 A1 * | 12/2006 | Rangel | 257/734 |
| 2007/0045788 A1 * | 3/2007 | Suzuki et al. | 257/666 |
| 2007/0126085 A1 * | 6/2007 | Kawano et al. | 257/621 |
| 2007/0138653 A1 * | 6/2007 | Bartley et al. | 257/786 |
| 2007/0152313 A1 * | 7/2007 | Periaman et al. | 257/686 |
| 2007/0294479 A1 * | 12/2007 | Emma | 711/122 |
| 2008/0054489 A1 * | 3/2008 | Farrar et al. | 257/777 |
| 2008/0083975 A1 * | 4/2008 | Chao et al. | 257/686 |
| 2010/0032820 A1 * | 2/2010 | Bruennert et al. | 257/686 |

OTHER PUBLICATIONS

Intel Corporation, "PCT Search Report and Written Opinion mailed May 13, 2008," PCT/US/2007086674.

Intel Corporation, Official Action from Patent Office of Russia Federation dated Jul. 12, 2010 for RU2009127834/28(038666).

Schaper, Leonard W., et al,, "Architectural Implications and Process Development of 3-D VLSI Z-Axis Interconnects Using Through Silicon Vias", *IEEE Transactions on Advanced Packaging*, vol. 28, No. 3, Aug. 2005, 356-364.

Intel Corporation, Office Action dated Apr. 19, 2011 for Chinese Application No. 200780047011.3.

* cited by examiner

US 8,110,899 B2

METHOD FOR INCORPORATING EXISTING SILICON DIE INTO 3D INTEGRATED STACK

FIELD

Integrated circuit packaging

BACKGROUND

Efforts are being made to stack chips or dice to increase performance without taking more space (e.g., more surface area) on a printed circuit board. This is particularly driven by requirements for sophisticated cell phones, smart phones, and other mobile devices. Chip makers have combined dynamic and static random access memory (DRAM and SRAM), flash and other memory in a connected integrated circuit structure or stack, but have historically been restrained by the added space requirements of wiring (e.g., wire bonding) that connects the chips. Chip or die stacking technology bonds two or more dies together to form a connected integrated circuit structure. The chips or dies may be connected together with interconnect wiring along the sides of the stack or metal vias at the die-die interfaces.

One common approach for chip or die stacking is referred to as face-to-face bonding. In this configuration, the device sides of, for example, two respective dies are stacked so that their device sides are facing one another and metal vias electrically connect the dies at the die-die interface. In one representation of a face-to-face bonded connected integrated circuit structure, a central processing unit (CPU) or logic die and a memory die (e.g., SRAM or DRAM die) are stacked together in a face-to-face bonding configuration. A heat sink may be attached to the bulk of the CPU or logic die and the power and input/output (I/O) connections to the package or circuit board are made with bump technology attached to the bulk of the memory die. Through-silicon vias (TSVs) may be used to pass through the memory die and connect to the metal die-to-die interface.

In the above example, since the through-silicon vias pass through the active silicon area of the memory of the second die (e.g., a memory die), sufficient area must be allocated in the circuitry to permit the through-silicon vias. These vias can typically be large (greater than 10 times) the minimum design rules for a given process due to power delivery requirements. Power for both dies is supplied by the through-silicon vias. Power requirements will dictate an approximately one through-silicon via per bump contact. In flip chip packaging, the bumps are usually arranged in a widely spaced uniform pattern across an entire two-dimensional die allowing for a high number of uniform power and ground connections at the top metal layer. This requires that the circuitry in the second die (e.g., memory die) be designed to accommodate these vias with proper spacing to adjacent geometries. This implies that the second die would need to be custom designed to exactly match the via requirements of the first die.

Another bonding configuration is a face-to-back bonding configuration. Using the example of a CPU die and a memory die, in a face-to-back bonding configuration, the position of the two die might be swapped. For example, the first die (CPU die) signal and power connections would be attached to the package in a typical way using standard bump technology. Power and signal connections for the second die (e.g., memory die) would pass through the first die using through-silicon vias. The power requirements of a memory die are usually much lower than a CPU or logic die and therefore the number of through silicon vias required to pass through the first die (e.g., CPU die) is considerably less and need not be uniformly spaced across the die. This makes the design and layout of a CPU die much less impacted by the three-dimensional bonding of a second die.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
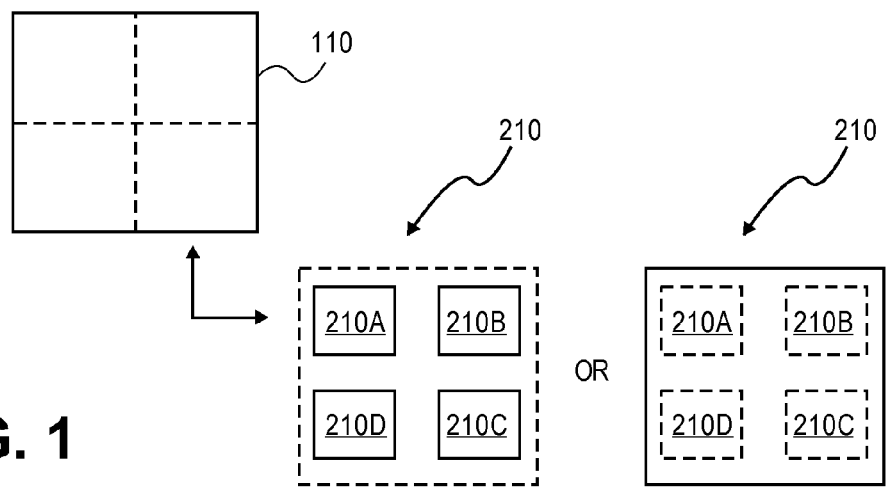
FIG. 1 shows a top exploded view of a connected integrated circuit structure including a first die and multiple singulated or unsingulated dice arranged to occupy a surface area of the first die.
Figure 2:
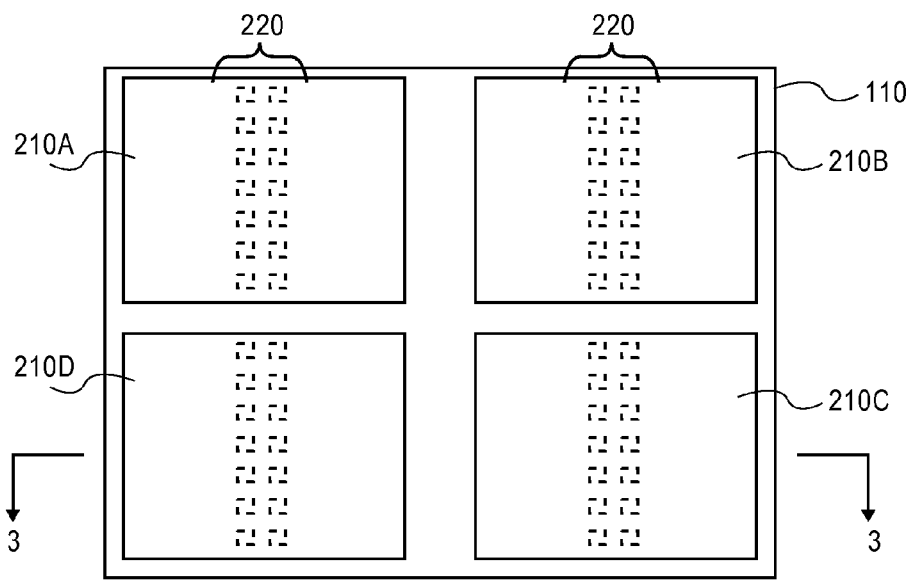
FIG. 2 shows a top side view of the structure of FIG. 1 and shows bond pads associated with each of the second dies.
Figure 3:
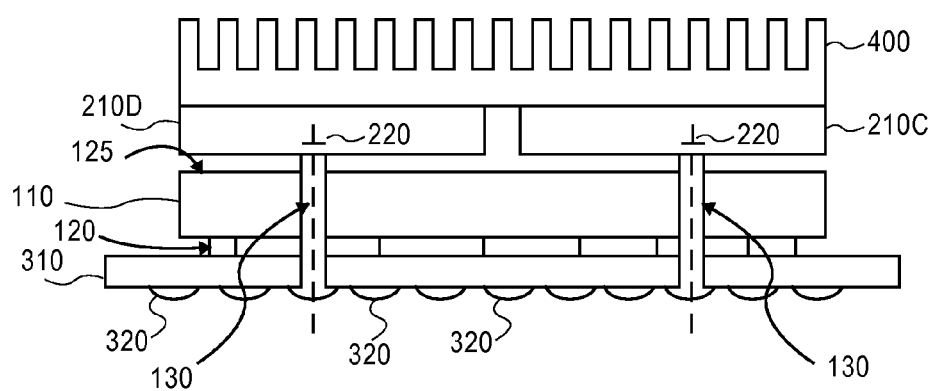
FIG. 3 shows a side view taken through line 3-3'.

FIGS. 1-3 show different views of an embodiment of a connected integrated circuit structure including first die 110 and a number of singulated or unsingulated second dice 210 electrically connected on die 110. Die 110 is for example a CPU or logic die. In one embodiment, dice 210 (collectively individual die 210A, die 210B, die 210C and die 210D) are memory dice (e.g., SRAM, DRAM) or other dice or a combination of different dice (e.g., logic and memory). The multiple dice represented by dice 210 collectively have a die size (surface area) approximating or matching a size (surface area) of first die 110. Representatively, die 110 that is a CPU or logic die may have, for example, a surface area of 400 square millimeters ($mm^2$). Each of dice 210 (die 210A, die 210B, die 210C, die 210D), in this example, have a surface area of 100 $mm^2$ such that the total surface area occupied by dice 210 is also 400 $mm^2$. Where dice 210 are memory structures such as DRAM, the dice may be selected such that collectively the dies constitute an acceptable match for DRAM density and die size. With respect to density, a DRAM die size may be one gigabyte (Gb) according to current technologies where the number of dice is four as shown. Alternatively, for less capacity DRAM (e.g., 512 kilobytes (Kb) or 256 Kb, the number of dies 210 may be greater (e.g., eight dies for 512 Kb at 60 $mm^2$ each (480 $mm^2$)).

FIG. 1 shows two examples of dice 210. In one example, each of dice 210 (die 210A, die 210B, die 210C and die 210D) are singulated and assembled as a distinct unit on die 110. Alternatively, the multiple dies may be scribed as a single unit and attached to die 110.

Memory dice (e.g., SRAM, DRAM) are readily available in either die or wafer form. These dice are commonly used in wire-bonded applications. Representatively, these dice may have 4-32 I/O plus power bond pads per die. These bond pads are usually arranged in a narrow one to two bond pad wide column through the center of the die. FIG. 2 shows dice 210

(e.g., die 210A, die 210B, die 210C and die 210D) having a two bond pad wide column through the center of each die of bond pads 220 (shown in ghost lines to illustrate the bond pads are on an opposite surface of the dice as viewed).

In one embodiment die 110 may be a multi-core processor. A multi-core processor generally has multiple complete execution cores in one physical processor, each running at the same frequency. Each core typically shares the same packaging. Referring to FIG. 1, die 110 may be, for example, a dual core processor, a quad-core processor (illustrated) or more.

In one embodiment, die 110 and dice 210 are connected in a face-to-back bonding configuration. Referring to FIG. 3, die 110 has a number of through-silicon vias (TSVs) 130 formed therein. Through-silicon vias 130 include a conductive material therethrough such as copper that is used to connect die 110 and/or contacts 320 on package 310 to contacts (e.g., bond pads) on dice 210 (die 210C and die 210D as shown). FIG. 3 shows die 110 with device side 120 adjacent and coupled to package 310 with through-silicon vias 130 extending through die 110 (from a device side to a back side (surface 125). Through-silicon vias of a conductive material such as copper may be formed as part of the processing steps that are utilized to make up die 110. In such manner, through-silicon vias 130 may be patterned to align with contact pads 220 (see FIG. 2) of the second dice. FIG. 3 shows through-silicon vias 130 extending from electrical contacts 320 (e.g., solder bumps on bond pads) to bond pads 220 of second dice 210C and 210D. Dice 210 may be arranged such that a device side (bond pad side) of each die is arranged on the back side of die 110. FIG. 3 also shows heat sink 410 connected to a back side of dice 210.

Figure 4:
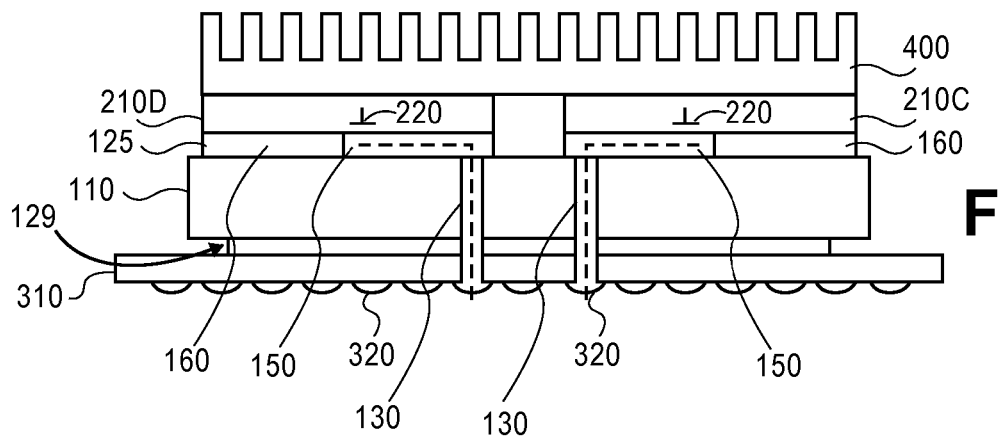
FIG. 4 shows the structure of FIG. 2 taken through line 3-3' and illustrating a redistribution layer to electrically connect the contacts on the second dies with through-silicon vias on the first die.
Figure 5:
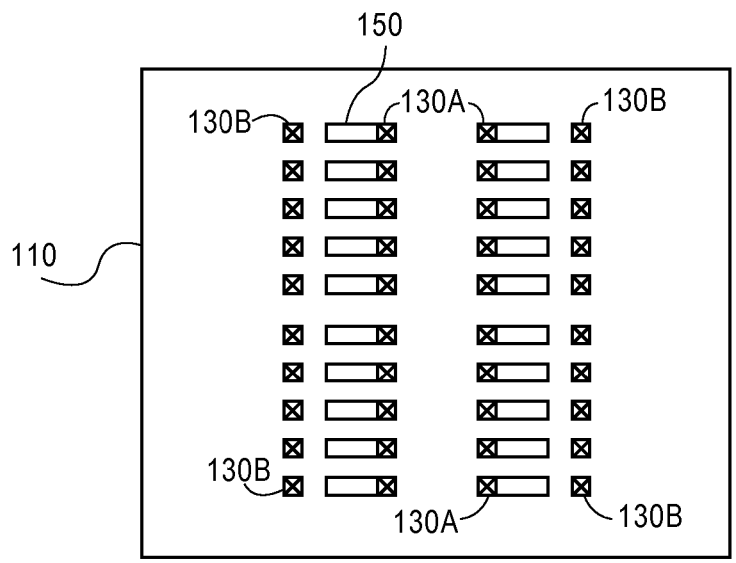
FIG. 5 shows an embodiment of a surface of the first die.

In some embodiments, through-silicon vias associated with die 110 will not be aligned with contacts (e.g., bond pads) of dice 210. In such situations, an electrically conductive redistribution layer, such as a metal (e.g., copper) layer, may be patterned on either the back side of die 110 or the device side of dice 210. Such a redistribution layer can serve as an interconnect between the contact points (e.g., bond pads) of dice 210 and through-silicon vias 130. FIG. 4 shows the connected integrated circuit structure of FIG. 2 through lines 3-3' layer according to another embodiment. In this example, contact points 220 of die 210C and die 210D are not aligned to through-silicon vias 130 extending between package 310 and through die 110. FIG. 4 shows redistribution layer 150 of, for example, a conductive material such as copper patterned, in one embodiment, on a back side of die 110. FIG. 5 shows a back side surface of die 110 having through-silicon vias 130A and 130B extending through die 110 to the back side surface. FIG. 5 also shows patterned redistribution layer 150 extending laterally from each through-silicon via 130A. In this example, through-silicon vias 130B would be aligned with contact points of second dice 210. Representatively, redistribution layer 150 may be a conductive material such as copper patterned using photolithographic techniques wherein, for example, a copper material is deposited on a back side surface of die 110 followed by a mask to define redistribution layer 150 and etching to pattern the redistribution layer as fingers extending laterally from through-silicon vias 130A to a desired position for electrical contact with contact points of second dice 210C and 210D. Redistribution layer 150 may be connected to contact points of dies 210 through, for example, solder connections as can through-silicon vias 130B.

Where necessary, a spacer material may be formed of, for example, a dielectric material in conjunction with the redistribution layer on a surface of die 110 or dies 210 to account for any gaps between the dies. FIG. 4 shows spacer material 160 formed with redistribution layer 150 on a surface of die 110.

Figure 6:
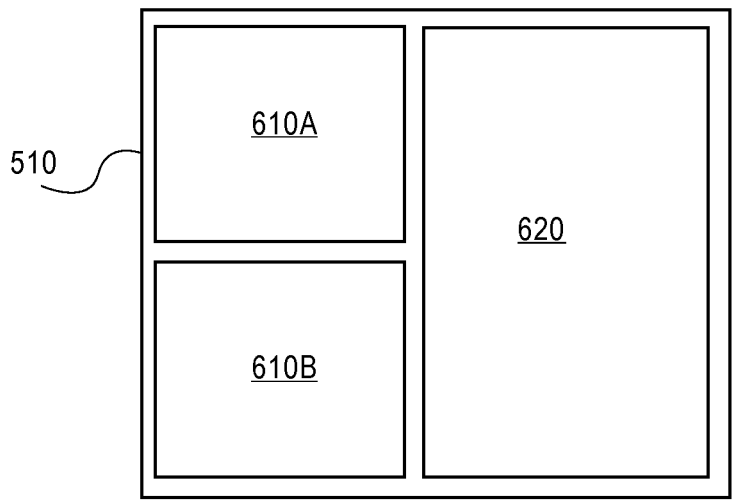
FIG. 6 shows another embodiment of a connected integrated circuit structure including a first die and a plurality of second dies.

In the description with reference to FIGS. 1-5, four dice 210 such as memory die (e.g., DRAM or SRAM) are shown each of the dice having a similar die size. It is appreciated that, in other embodiments, dice having different functions and different sizes may be stacked on top of one another. FIG. 6 shows a top view of a connected integrated circuit structure of die 510 of, for example, a CPU or logic die. Arranged on a surface (e.g., a back side surface) of die 510 are dice 610A and 610B of, for example, DRAM memory. Also on a back side of die 510 is die 620 having a die size (cross-sectional area) greater than die 610A or die 610B. Die 620 is, for example, SRAM memory. In this example, die 610A, die 610B and die 620 are described as memory dice, but it is appreciated that other forms of die may be used as well, such as CPU or logic dice.

Figure 7:
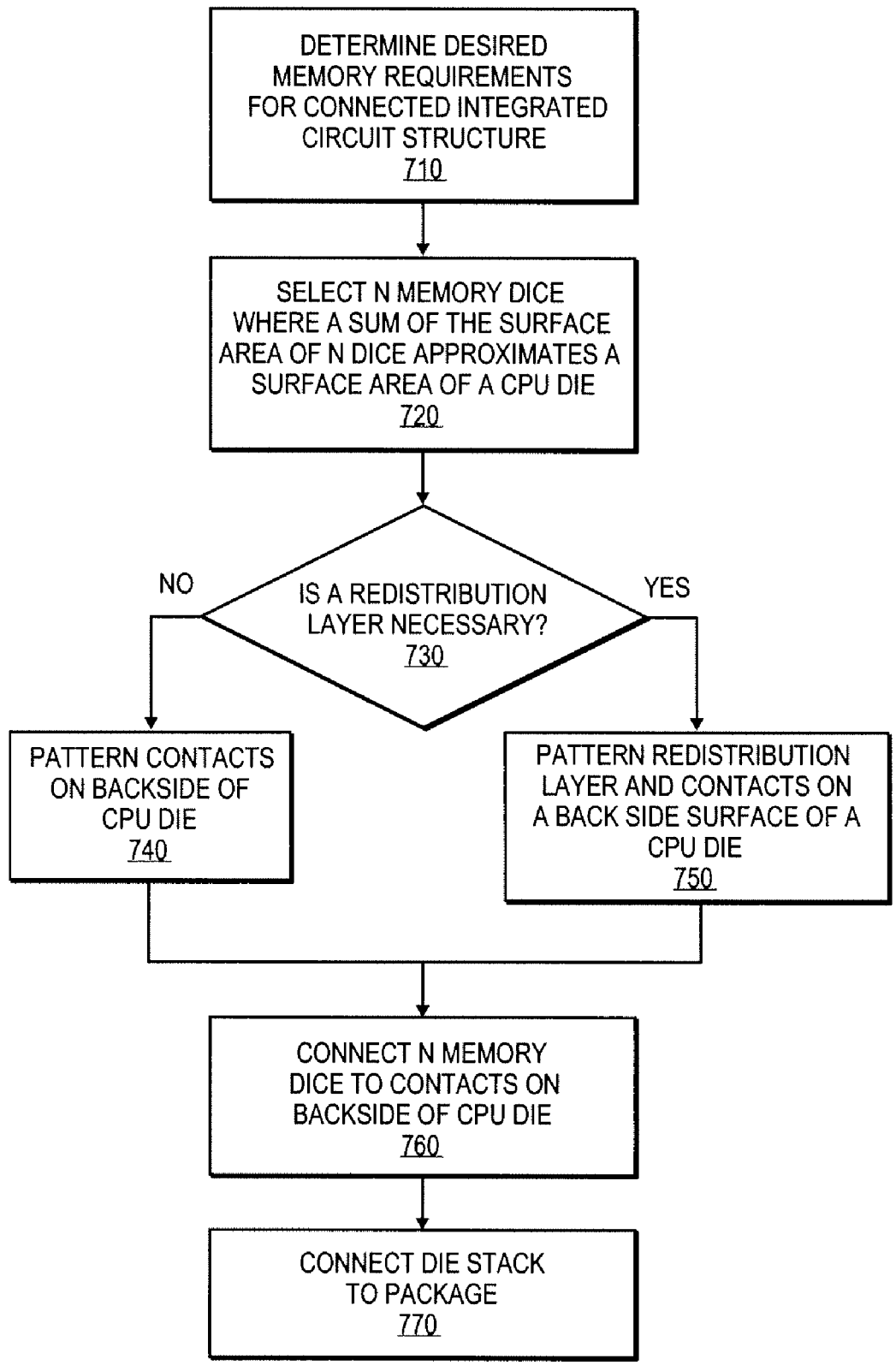
FIG. 7 shows a flow chart of an embodiment of a method of forming a connected integrated circuit structure.

FIG. 7 shows a flow chart of a method of forming a connected integrated circuit structure. In this embodiment, memory dice will be assembled on a surface, such as a back side surface of a CPU or logic die. As noted above, it is appreciated that the selection of the type of die may vary.

Referring to FIG. 7, in this embodiment, initially the memory requirements for a connected integrated circuit structure are determined (block 710). For example, the desired memory requirements may be one gigabyte (Gb) of DRAM memory for a connected integrated circuit structure.

Having determined the memory requirements, a number of memory dice are then selected such that a sum of the surface area of multiple dice approximate the surface area (e.g., a back side surface area) of a CPU logic die (block 720). For example, where a surface area of a CPU or logic die is 400 $mm^2$, and one Gb DRAM memory chips are available having a surface area of 100 $mm^2$, four DRAM memory chips (4×100 $mm^2$) approximates a surface area of the CPU or logic die.

Following the selection of the memory dice, the contact points (power and I/O contact points) of the memory dice are examined and a pattern compared to a pattern of through-silicon vias desired for the CPU logic die. At that point, a determination is made whether a redistribution layer is necessary (block 730). If no redistribution layer is necessary, the contacts may be patterned on the back side of CPU or logic die (block 740). If a redistribution layer is necessary, a redistribution layer is patterned on a back side surface of a CPU or logic die and contacts established to the redistribution layer (block 750).

Once contacts are established on a surface (e.g., back side surface) of a CPU die, the multiple memory dies are connected to the CPU or logic die by, for example, solder connections (block 760). Following the connection of the memory dies to the CPU or logic die, the connected die stack may be connected to a substrate package including the through-silicon vias that extend to the memory dies (block 770). A heat sink and any other processing techniques typically utilized in assembling package substrates may then follow.

Figure 8:
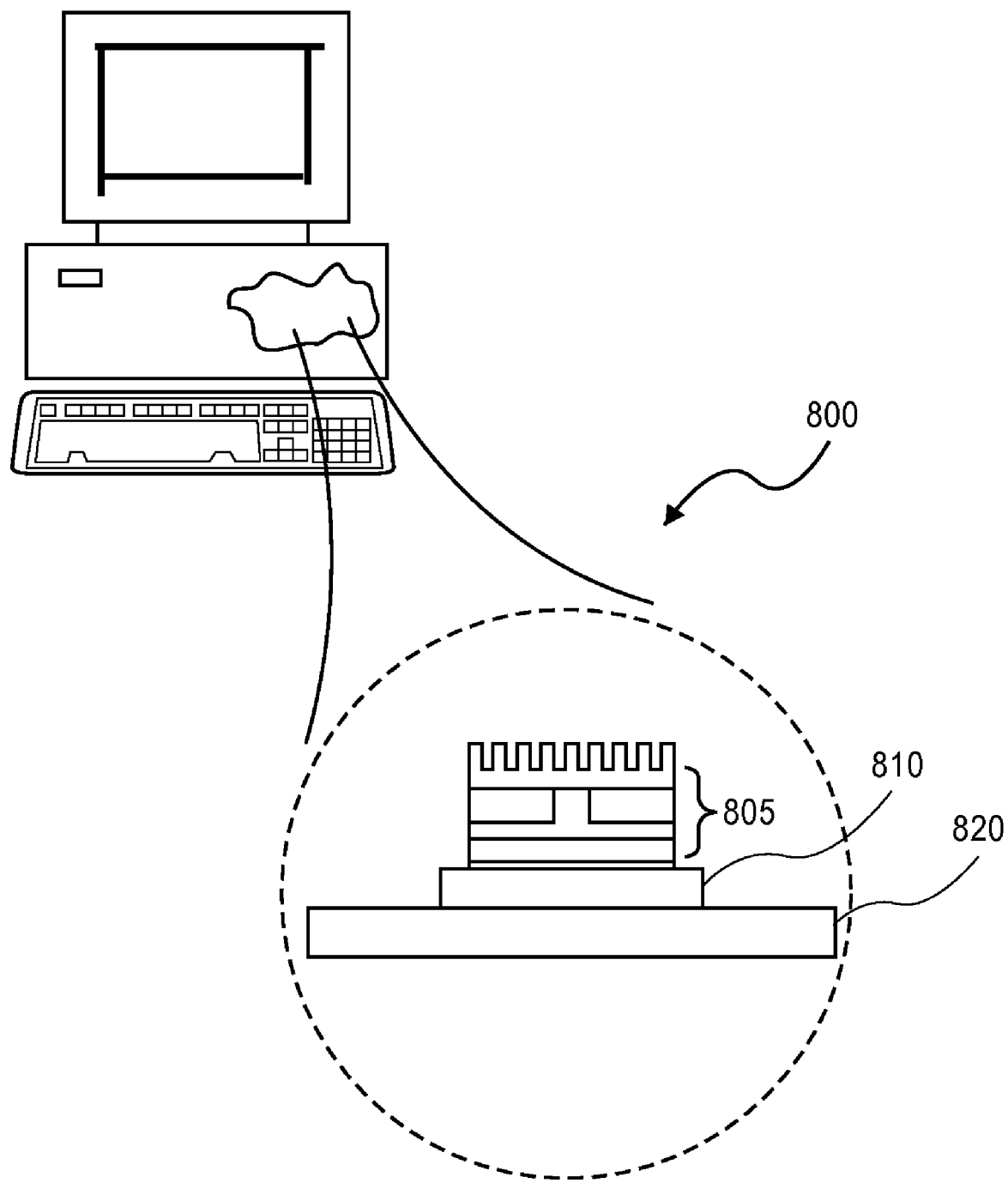
FIG. 8 shows a schematic side view of an electronic assembly as part of a desktop computer.

FIG. 8 shows a side view of an electronic assembly including a connected integrated circuit structure that can be physically and electrically connected to a printed wiring board or printed circuit board (PCB). The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tape and compact disc player, video cassette recorder, MP3 (motion picture experts group, audio layer 3 player, etc.), and the like. FIG. 8 illustrates the package is part of a desktop computer. FIG. 8 shows electronic assembly 800 including connected integrated circuit structure 805 physically and electrically connected to package substrate 810. Package substrate 810 may be used to connect die 100 to printed circuit board 820, such as a motherboard or other circuit board.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. An apparatus comprising:
    a first die comprising a plurality of conductive through substrate vias (TSVs), the first die comprising a surface area, the first die comprising a first device side and a first back side, the first device side adjacent and coupled to a package; and
    a plurality of second dice each comprising a functional circuit and a plurality of contact points coupled to the TSVs of the first die, the plurality of second dice arranged to collectively comprise a surface area approximating or at most matching the surface area of the first die, and each of the plurality of second dice comprising a second device side and a second back side, the second device side adjacent and coupled to the first back side of the first die,
        wherein the first die comprises a multi-core processor, and the plurality to second dice are configured so that each of the plurality of second dice is arranged on respective cores of the multi-core processor.

2. The apparatus of claim 1, wherein the first die and the plurality of second dice are coupled in a face-to-back bonding configuration.

3. The apparatus of claim 2, wherein the first die comprises a CPU or logic die.

4. The apparatus of claim 3, wherein the plurality of second dice comprise memory units.

5. The apparatus of claim 3, wherein the plurality of second dice comprise dynamic random access memory units.

6. The apparatus of claim 1, wherein the first die further comprises a plurality of contact points coupled to the TSVs through a conductive redistribution layer and the plurality of contact points of each of the second dice are coupled to the plurality of contact points of the first die.

7. A method comprising:
    arranging a first die on a package, the first die comprising a first device side and a first back side, the first device side adjacent and coupled to the package;
    arranging a plurality of second dice on the first die such that collectively the plurality of second dice comprise a surface area approximating the surface area of the first die, and each of the plurality of second dice comprising a second device side and a second back side, the second device side adjacent and coupled to the first back side of the first die; and
    electrically coupling the plurality of second dice to a plurality of conductive through substrate vias (TSVs) of the first die,
        wherein the first dice comprises a multi-core processor and arranging the plurality of second dice on the first die comprises arranging so that each of the plurality of second dice is coupled to respective ones of the cores of the multi-core processor.

8. The method of claim 7, wherein the first die and the plurality of second dice are coupled in a face-to-back bonding configuration.

9. The method of claim 8, wherein the first die comprises a CPU or logic die.

10. The method of claim 9, wherein the plurality of second dice comprise memory units.

11. The method of claim 9, wherein the plurality of second dice comprise dynamic random access memory units.

12. The method of claim 7, wherein the first die comprises a plurality of contact points coupled to the TSVs through a conductive redistribution layer and coupling the plurality of second dice comprises coupling contact points of the plurality of second dice to the plurality of contact point of the first die.

13. A system comprising:
    an electronic appliance including a printed circuit board and a module coupled to the printed circuit board, the module comprising:
        a first die comprising a plurality of conductive through substrate vias (TSVs), the first die comprising a surface area, the first die comprising a first device side and a first back side, the first device side adjacent and coupled to a package; and
        a plurality of second dice each comprising a functional circuit and a plurality of contact points coupled to the TSVs of the first die, the plurality of second dice arranged to collectively comprise a surface area approximating the surface area of the first die, and each of the plurality of second dice comprising a second device side and a second back side, the second device side adjacent and coupled to the first back side of the first die,
            wherein the first die comprises a multi-core processor, and the plurality to second dice are configured so that each of the plurality of second dice is arranged on respective cores of the multi-core processor.

14. The system of claim 13, wherein the first die and the plurality of second dice are coupled in a face-to-back bonding configuration.

15. The system of claim 14, wherein the first die comprises a CPU or logic die.

16. The system of claim 15, wherein the plurality of second dice comprise memory units.

17. The system of claim 15, wherein the plurality of second dice comprise dynamic random access memory units.

18. The system of claim 13, wherein the first die further comprises a plurality of contact points coupled to the TSVs through a conductive redistribution layer and the plurality of contact points of each of the second dice are coupled to the plurality of contact of the first die.

* * * * *